United States Patent [19]

Goldberg

[11] 4,303,893

[45] Dec. 1, 1981

[54] FREQUENCY SYNTHESIZER INCORPORATING DIGITAL FREQUENCY TRANSLATOR

[75] Inventor: Edwin A. Goldberg, Princeton, N.J.

[73] Assignee: RCA Corporation, New York, N.Y.

[21] Appl. No.: 17,101

[22] Filed: Mar. 5, 1979

[51] Int. Cl.[3] .......................... H03L 7/18; H03L 7/26
[52] U.S. Cl. ........................................ 331/1 A; 331/3; 331/22; 331/25; 331/31
[58] Field of Search ................... 331/1 A, 3, 18, 25, 331/30, 22, 31

[56] References Cited

U.S. PATENT DOCUMENTS

| | | | |
|---|---|---|---|
| 2,942,203 | 6/1960 | Winkler | 331/31 X |
| 3,166,888 | 1/1965 | Kartaschoff | 331/3 X |
| 3,339,148 | 8/1967 | Woodward | 331/3 |
| 3,928,813 | 12/1975 | Kingsford-Smith | 331/1 A |

Primary Examiner—Siegfried H. Grimm
Attorney, Agent, or Firm—Samuel Cohen; George J. Seligsohn

[57] ABSTRACT

The use of a digital frequency translator, using pulse snatching techniques, for multiplying the output frequency of a precise and accurate frequency synthesizer by a preselected certain numerical fraction permits the frequency synthesizer to be referred to a molecular clock with only a single VCXO phase lock loop.

8 Claims, 4 Drawing Figures

FREQUENCY SYNTHESIZER INCORPORATING DIGITAL FREQUENCY TRANSLATOR

This invention relates to a frequency synthesizer incorporating a digital frequency translator and, more particularly, to such a synthesizer which is suitable for use with a reference clock signal derived from a molecular clock.

The term "molecular" clock, as used herein, means an oscillator that employs a predetermined molecular material as a frequency-determining means therefore and which produces an output frequency of a value which essentially is determined by the inherent characteristics of either the molecules themselves of the frequency-determining material, the inherent characteristics of a particular atomic component of such molecules or the inherent characteristics of a particular nuclear component of an atom of such molecules. One example of a molecular clock is a cesium clock, which produces an extremely narrow line in the microwave electromagnetic spectrum at a stable frequency which now is used as the primary time standard. Another example is a maser which generates a frequency in the microwave portion of the radio electromagnetic spectrum (the particular frequency of any maser being determined by the molecules of the particular active masing material employed).

The exact frequency of a molecular clock may depend to a small extent on such extrinsic parameters as the temperature of the resonant frequency of the microwave cavity containing frequency-determining material molecules and the strength of a D.C. magnetic field within the space occupied by the frequency-determining material molecules. However, by controlling the spatial uniformity and temporal constancy of the respective values such extrinsic parameters, molecular clocks may be used as extremely accurate and precise frequency standards. For example a monatomic hydrogen (H) maser may be used to generate a clock signal at an accurate clock frequency, such as 1420405751.68 Hz within a frequency range extending from 1420405751.308 Hz to 1420405751.826 Hz. Further, this accurate clock frequency signal, generated by a hydrogen maser, can be maintained with a precision in the order of one part in $10^{14}$ to one part in $10^{15}$ or even less.

The inherent frequency of a clock signal generated by a molecular clock is normally different from the desired operating frequency of a system requiring the very accurate and precise timing of a molecular clock. Therefore, it is customary to apply a clock signal from a molecular clock as a reference frequency to a frequency synthesizer, which derives an output signal at a desired operating frequency with an accuracy and precision determined by that of the applied molecular clock reference signal.

In general, a frequency synthesizer includes a voltage controlled oscillator (VCO) for generating the useful output signal, a phase-lock loop responsive to the respective frequencies of the output signal and a reference clock signal for modifying the control voltage to the VCO to thereby reduce any error in frequency of the output frequency of the VCO. Prior art frequency synthesizers that are designed to generate an output signal with high frequency accuracy and precision employ a voltage-controlled crystal oscillator (VCXO) and use an applied reference clock signal of high accuracy and precision (e.g. that derived from a molecular clock).

The accurate and precise frequency synthesizer of the present invention is similar to accurate and precise frequency synthesizers of the prior art in these two respects. However, the type of phase locked loop employed by the frequency synthesizer of the present invention differs markedly from the type of phase-locked loop employed by accurate and precise frequency synthesizers of the prior art.

Specifically, besides employing a main phase-lock loop, accurate and precise frequency synthesizers of the prior art employ one or more subsidiary phase-lock loops (the number of subsidiary phase-lock loops tending to increase as the required frequency accuracy and precision increases). However, the accurate and precise frequency synthesizer of the present invention employs a novel digital frequency translator, rather than any subsidiary phase-lock loops. This digital frequency translator multiplies the then-existing frequency of the input signal of the frequency synthesizer by a preselected certain numerical proper fraction that produces just the correct product frequency required of one of two control signals applied to a phase detector of the one and only phase-lock loop of the frequency synthesizer of the present invention.

Frequency synthesizer 100, which incorporates the present invention, generates an output signal, present on conductor 102, at a first specified frequency $f_s$ with a precision determined by that of an accurate and precise applied clock signal, on conductor 104, having a second specified frequency $f_m$ higher than the first specified frequency. The second specified frequency $f_m$ is generated by some predetermined molecular clock 106. Therefore, the value of this second specified frequency $f_m$ is determined by inherent characteristics of molecular clock 106, as discussed above. However, the value of the first specified frequency $f_s$ of the output signal of frequency synthesizer 100 is independently chosen to be equal to a particular desired operating frequency. Therefore, there need not be and generally is no harmonic relationship between the first specified frequency of the output signal from synthesizer 100 and the second specified frequency $f_m$ of the output from molecular clock 106.

Figure 1:
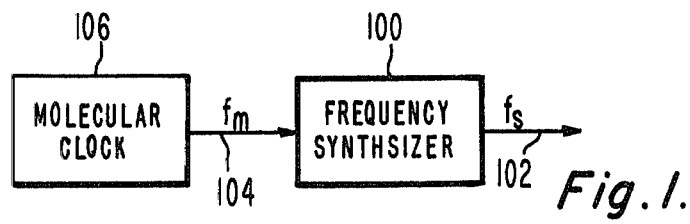
FIG. 1 is a block diagram of a molecular clock and a frequency synthesizer.
Figure 2:
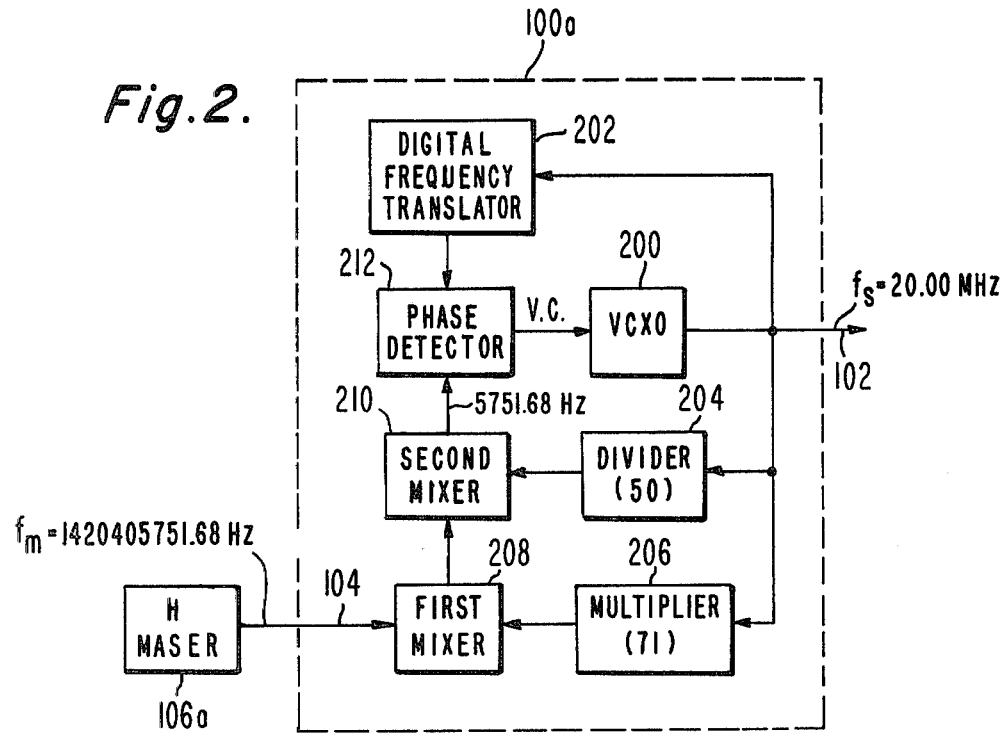
FIG. 2 shows an illustrative embodiment of the present invention.

Referring now to FIG. 2, H maser 106a and frequency synthesizer 100a constitute respective illustrative embodiments of molecular clock 106 and frequency synthesizer 100 of FIG. 1. The frequency $f_m$ of a typical H maser 106a has some particular certain value in a frequency range between 1420405751.308–1420405751.826 Hz. As known in the maser art, the exact value of $f_m$ in this range depends upon the exact value of the D.C. axial magnetic field strength within the region occupied by the active masing material (i.e. excited H atoms). For illustrative purposes, it is assumed that $f_m$ has the nominal value 1420405751.68 Hz.

Frequency synthesizer 100a comprises VCXO 200, which produces an output signal on conductor 102 having a frequency $f_s$ which, for illustrative purposes, is assumed to be 20.00 MHz. An example of a commercially-available suitable VCXO, that produces an output signal of 20.00 MHz, is Vectron Model 252-2086, manufactured by Vectron Laboratories, Norwalk, Conn.

As shown in FIG. 2, the output signal from VCXO 200 is applied as an input to digital frequency translator 202, divider 204 and multiplier 206. Multiplier 206, which, as shown, is responsive to the 71st harmonic of the then-existing VCXO output signal frequency, applies a signal frequency of 1420 MHz as a first input to first mixer 208. Divider 204, as shown, derives a signal frequency at the 50th subharmonic of the then-existing VCXO output signal frequency the latter serving as a synchronizing input to divider 204. In terms of actual frequencies, the divider 204 applies a 400 kHz as a first input to second mixer 210.

The output signal from H maser 106a on conductor 104, having a precise second specified reference frequency $f_m$ of 1420405751.68 Hz, is applied as a second input to first mixer 208. The output signal from first mixer 208, which has a frequency equal to the frequency difference between the first and second inputs to first mixer 208, is applied as a second input to second mixer 210. If, and only if, the then-existing value of the output signal frequency VCXO 200 is exactly a first specified frequency of 20 MHz with the extreme precision of the maser (in a range of one portion $10^{14}$–$10^{15}$ or better) second mixer 210 will derive an output at a third specified frequency of exactly 5751.68 Hz. Any frequency error from this first specified frequency in the output signal from VCXO 200 results in the output of second mixer 210 exhibiting an audio frequency value differing from 5751.68 Hz, by an amount equal to the error. The output signal from second mixer 210 is applied as a first control signal input to phase detector 212. From the foregoing discussion, it is plain that divider 204, multiplier 206, first mixer 208 and second mixer 210 cooperatively operate as a frequency down-converter responsive to the frequency difference between a second specified frequency (i.e. $f_m$) and the sum of a certain number of derived frequencies harmonically related to the then-existing frequency of the output signal ($f_s$) for producing the aforesaid first control signal at a third specified frequency (5751.68 Hz) only when the then-existing frequency of the output siganl has exactly the first specified frequency (i.e. exactly 20 MHz with the precision of the second specified frequency).

The output signal from VCXO 200 is also applied as an input to digital frequency translator 202, as stated above. Digital frequency translator 202 (which is shown in more detail in FIGS. 3 and 4 discussed below) performs the function of multiplying the then-existing frequency of the VCXO output by that preselected certain numerical proper fraction which produces a product frequency, for the output of the digital frequency translator 202, which has a value equal to 5751.68 Hz (the third specified frequency) only when the then-existing frequency of the VCXO has exactly its precise (first specified) frequency. The signal appearing at the output of digital frequency translator 202 is applied as a second control signal input to phase detector 212.

Phase detector 212 derives a control voltage which is applied as a voltage control (V.C.) to VCXO 200. This control voltage effects a reduction in any error between the actual, then-existing frequency of the VCXO output signal and its precise first specified frequency.

Since the first control signal input to phase detector 212 is based on a difference frequency (with respect to the accurate and precise H maser reference frequency $f_m$), while the second control signal input to phase detector 212 is based on a product frequency (which bears a fixed ratio with respect to the actual then-existing frequency of the VCXO output signal), the respective first and second control signals vary at substantially different rates with respect to the amount of frequency error in the output signal from VCXO 200. This results in high-sensitivity error detection by phase detector 212.

Figure 3:
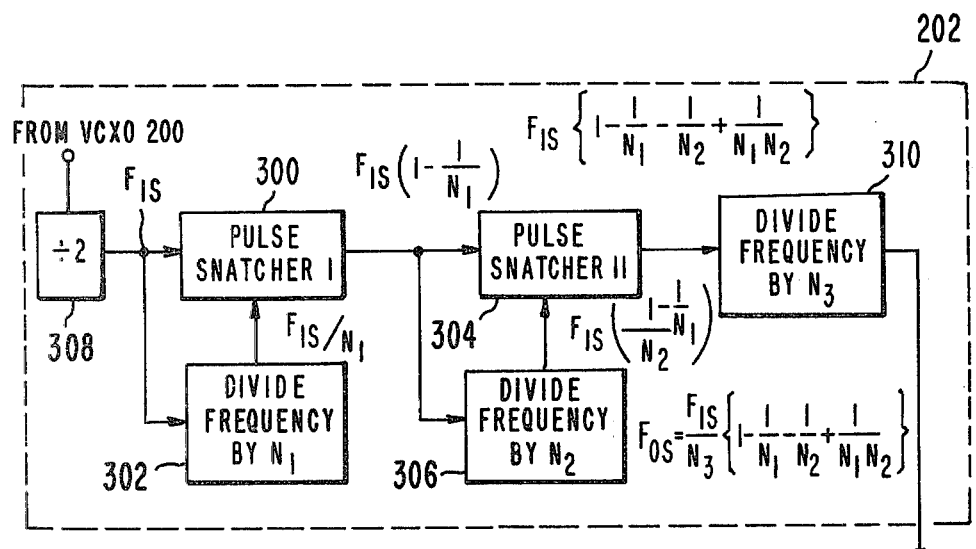
FIG. 3 is a block diagram of an illustrative embodiment of the digital frequency translator of FIG. 2, and FIG. 4 schematically illustrates a particular embodiment of the pulse snatchers and frequency dividers of FIG. 3.

Referring to FIG. 3, there is shown in block form an illustrative embodiment of digital frequency translator 202. In FIG. 3, digital frequency translator 202 comprises an ordinal series of two pulse snatchers, each of which has its own associated preselected-integer frequency divider interconnected thereto. Specifically, as shown in FIG. 3, pulse snatcher I 300 has divide-frequency-by-$N_1$ circuit 202 associated therewith and pulse snatcher II 304 has divide-frequency-by-$N_2$ circuit 306 associated therewith. Divide-by-two circuit 308, in response to the output signal from VCXO 200 being applied as an input thereto, derives a serial stream of pulses having a frequency $F_{is}$ equal to ½ the frequency of the output signal from VCXO 200. The output from divide-by-two circuit 308 is applied as an input to both pulse snatcher I 300 and $N_1$ frequency divider 302. Although preferred, it is not essential that the frequency of VCXO 200 be divided by two prior to being applied to pulse snatcher I 300 and $N_1$ frequency divider 302. Alternatively, the stream of pulses at the frequency of the output signal from VCXO 200 can be applied directly to inputs of pulse snatcher I 300 and divider $N_1$ frequency divider 302. However, in this case, the preselected value of $N_3$ would have to be twice as large as when divide-by-two circuit 308 is employed (which necessitates a more complex frequency divider circuit 302 capable of operating at a higher frequency).

Frequency divider 302 derives an output pulse for each count of successive input pulses equal in number to the value of the preselected integer $N_1$ of frequency divider 302. Therefore, the output pulse frequency of frequency divider 302 is $$F_{is}/N_1, \qquad (1)$$

Pulse snatcher I 300 removes one pulse from the serial stream of pulses forwarded from its input to its output for each one input pulse applied thereto from frequency divider 302. Thus, the average frequency of the serial stream of pulses emerging from pulse snatcher I300 is $$F_{is}\left(1 - \frac{1}{N_1}\right), \qquad (2)$$

Pulse snatcher II 304 and its associated $N_2$ frequency divider 306 operate in the same manner as pulse snatcher I 300 and its frequency divider 302. Therefore, the output pulse frequency of frequency divider 306 is equal to the input pulse frequency thereto divided by the preselected integer $N_2$; namely, $$F_{is}\left(\frac{1-\frac{1}{N_1}}{N_2}\right), \quad (3)$$

Further, the frequency of the output of pulse snatcher II 304 is equal to the difference between the input pulse frequency thereto and the output pulse frequency of frequency divider 306; namely, $$F_{is}\left(1 - \frac{1}{N_1} - \frac{1}{N_2} + \frac{1}{N_1N_2}\right), \quad (4)$$

Divide-frequency-by-$N_3$ circuit 310 comprises an additional frequency divider for dividing the output frequency of pulse snatcher II 304 by the value of a preselected integer $N_3$. Therefore, the output frequency $F_{os}$ of frequency divider 310, which constitutes the output frequency of digital frequency translator 202, is given by the equation $$F_{os} = \frac{F_{is}}{N_3}\left(1 - \frac{1}{N_1} - \frac{1}{N_2} + \frac{1}{N_1N_2}\right), \quad (5)$$

It has been assumed that the output signal frequency of VCXO 200 is 20.00 MHz. Therefore, $F_{is}$ is 10.00 MHz. From the foregoing equation (expression 5 above), it can be shown that the output frequency $F_{os}$ will be exactly 5751.68 Hz when the output signal from VCXO 200 has its precise first specified frequency, if the respective preselected values of integers $N_1$, $N_2$ and $N_3$ are $N_1=28409$, $N_2=3100$ and $N_3=1738$.

Figure 4:
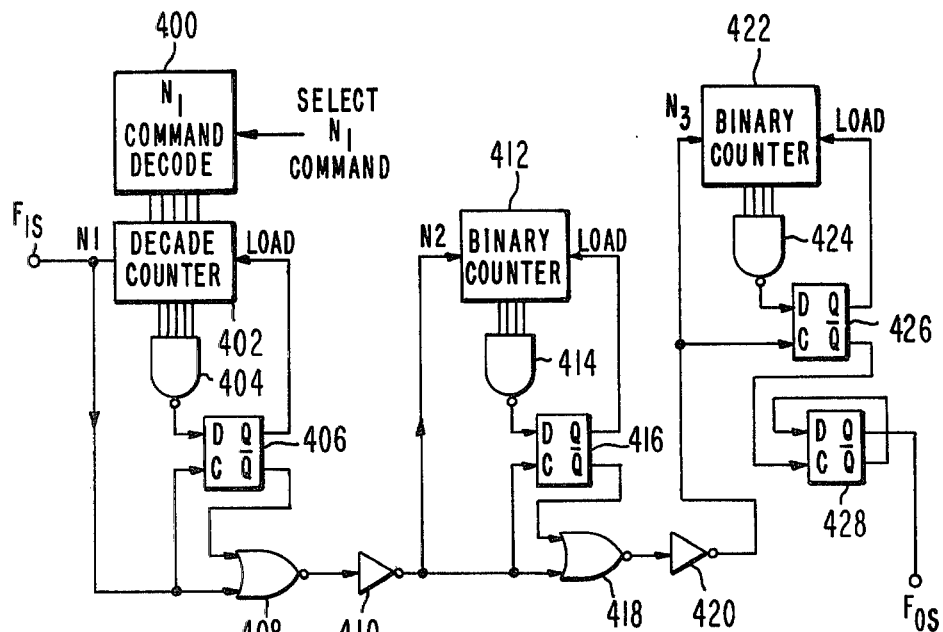

Referring now to FIG. 4, there is schematically shown an embodiment of the frequency dividers and pulse snatchers of FIG. 3. The $N_1$ frequency divider 302 is comprised of $N_1$ command decode circuit 400, decade counter 402 and NAND gate 404. Pulse snatcher I 300 is comprised of D flip-flop 406, NOR gate 408 and inverter 410. $N_1$ command decode 400 comprises programmed means, such as five sets of binary-coded decimal switches for preselecting any value of $N_1$ up to 100,000. However, the minimum value of $N_1$, in practice, is normally never set below 10,000 (as discussed below). A select $N_1$ command signal may be employed to effect the setting of a particular value of $N_1$ in command decode 400. While this select $N_1$ command may originate locally, it may also originate remotely and be radio-communicated to the synthesizer (such as when the molecular clock and synthesizer are located on a spacecraft).

The use of NAND gate 404 minimizes delay through the counter chain of decade counter 402 and provides an output pulse to the D input of flip-flop 406 only when division by $N_1$ is completed by decade counter 402.

The presence of the output pulse (low) from gate 404 input causes flip-flop 406 to change state with the $\overline{Q}$ output going high and the Q output low. The low Q output loads the preset value required for division by $N_1$ into counter 402.

The $\overline{Q}$ output serves as one input to NOR gate 408. The other input to NOR gate 408 is the input signal $F_{is}$. If $\overline{Q}$ is low, the output of NOR gate 408 is $F_{is}$ shifted in phase by 180°. When $\overline{Q}$ is high each time an output pulse from gate 404 is generated, the output of NOR gate 408 remains low. This condition exists for one cycle of $F_{is}$, since the next positive going cycle of $F_{is}$ resets flip-flop 406, returning $\overline{Q}$ to the low state and Q to the high state. Since an output pulse from gate 404 is generated each time division of $F_{is}$ by $N_1$ is completed, pulses of $F_{is}$ are suppressed or "snatched" at a rate $F_{is}/N_1$.

$N_2$ frequency divider 306 is comprised of binary counter 412 and NAND gate 414. Pulse snatcher II 304 is comprised of D flip-flop 416, NOR gate 418 and inverter 420. The output from the first pulse snatcher is applied to the second pulse snatcher through inverter 410. Other than the fact that the $N_2$ frequency divider employs binary counter 412, instead of programmed decade counter 402, the operation of the second pulse snatcher is similar that described above in connection with the first pulse snatcher.

The output of the second pulse snatcher is applied as an input to $N_3$ additional frequency divider 310. Frequency divider 310 is comprised, in part, of binary counter 422, NAND gate 424, and flip-flop 426, which operate as a N/2 frequency divider. In particular, flip-flop 426 is switched by an output pulse from gate 424 in response to $N_3/2$ pulses applied to binary counter 422 from inverter 420. Additional frequency dividier 310 further includes flip-flop 428 which is connected as a divide-by-two count to produce a symmetrical output waveform. In this manner, frequency divider 310 produces an overall division by $N_3$. The $F_{os}$ frequency output signal of frequency divider 310, which constitutes the output signal of digital frequency translator 202, is derived at the Q output of flip-flop 428.

A molecular clock and frequency synthesizer, of the type shown in FIGS. 2, 3 and 4, may be located in each of a group or orbiting spacecraft. Such a group of orbiting spacecraft has been proposed for use in a precise navigation system for ships at sea and for use in very long base line interferometry (VLBI) radio astronomy. However, in such uses, over a long period of time, the nominal frequency $f_m$ of H maser 106a may change slightly. In this case, the frequency synthesizer output frequency $f_s$ may be maintained at its first specified frequency by radioing a command to $N_1$ command decode 400 in a spacecraft to appropriately change the preselected value of integer $N_1$. A range of preselcted values between 10,000 and 100,000 for N permits the VCXO frequency to be set at exactly 20.00 MHz for a range of maser frequencies from 1420405751.308 Hz to 14204051.826 Hz.

In the arrangement shown in FIG. 4, neither binary counter 412 nor binary counter 422 is programmable. However, if desired, either of these counters could be made programmable. Changes in the preselected value of $N_3$ could be used to produce offsets of several hertz in the frequency of the output signal. Such offsets are useful in some frequency and stability measuring schemes where a comparison is made between two frequency standards. For example, a change in preselected value of $N_3$ from 1738, 1717 produces a change in the VCXO frequency of approximately 1 Hz.

The invention, as envisioned, may utilize pulse adders, in lieu of pulse snathcers. However, a "divide-frequency-by $N_3$" circuit is still used in the pulse adder embodiment to derive an audio-frequency output which is equal to the then-existing frequency of the VCXO output signal multiplied by the appropriate preselected certain numerical proper fraction.

What is claimed is:

1. In a frequency synthesizer for generating an output signal at a first specified frequency with a precision determined by that of an accurate and precise applied clock signal having a second specified frequency higher than said first specified frequency, said first and second specified frequencies bearing no harmonic relationship therebetween; said synthesizer comprising:

first means including a voltage-controlled crystal oscillator, a phase detector coupled to said oscillator for generating a control voltage applied to said oscillator having a value determined by the phase difference between first and second control signals applied as respective inputs to said phase detector, said control voltage applied to said oscillator effecting a reduction in any error between the actual then-existing frequency of said output signal and said first specified frequency;

second means for producing said first control signal, said second means including a frequency downconverter responsive to the frequency difference between said second specified frequency and the sum of a certain number of derived frequencies harmonically related to the then-existing frequency of said output signal for producing said first control signal, said first control signal having a third specified frequency only when the then-existing frequency of said output signal has exactly said first specified frequency, said third specified frequency being lower than said second specified frequency; and third means for producing said second control signal, said third means including a digital frequency translator for multiplying the then-existing frequency of said output signal by that preselected certain numerical proper fraction which produces a product frequeny for said second control signal having a value equal to said third specified frequency only when the then-existing frequency of said output signal has exactly said first specified frequency;

wherein said digital frequency translator includes an ordinal series of a predetermined number of pulse snatchers each having its own associated preselected-integer frequency divider individually interconnected thereto, each pulse snatcher and its frequency divider being responsive to a serial stream of successive pulses applied as an input thereto for removing from said serial stream forwarded to the output of that pulse snatcher one pulse for each count of successive input pulses equal in number to the value of the preselected integer associated with that frequency divider, coupling means for applying as an input to the first of said ordinal series of pulse snatchers a serial stream of pulses derived from and in time synchronous relationship with the frequency of the output signal of said synthesizer and for applying as an input to each other pulse snatcher of said ordinal series the output of the pulse snatcher immediately preceding that other pulse snatcher, and an additional preselected-integer frequency divider having the output of the last pulse snatcher in said ordinal series applied as an input thereto, said respective values of said preselected integers of said frequency dividers being chosen to produce said product frequency for said second control signal at the output of said additional frequency divider.

2. The synthesizer defined in claim 1, wherein said predetermined number of said ordinal series is two.

3. The synthesizer defined in claim 2, wherein said value of said preselected integer associated with said first pulse snatcher in said ordinal series is a certain integer value in the range of ten-thousand to one-hundred thousand.

4. The synthesizer defined in claim 3, wherein said digital frequency translator further includes programmed means for adjusting said certain integer value to any single integer value in said range of ten-thousand to one-hundred thousand.

5. The frequency synthesizer defined in claim 4, wherein said first specified frequency of said frequency synthesizer output signal is 20.00 MHz and wherein said coupling means includes means for applying as an input to the first of said ordinal series of pulse snatchers a serial stream of pulses having a frquency one-half of that of said frequency synthesizer output signal.

6. The frequency synthesizer defined in claim 5, wherein said second specified frequency is a certain frequency in the range of 142045751.308–142045751.826 Hz, the value of said preselected integer associated with the second pulse snatcher in said ordinal series is 3100, the value of said preselected integer associated with said additional frequency divider is 1738, and said certain integer value of said preselected integer associated with said first pulse snatcher of said ordinal series is adjusted to have that single value in said range of ten-thousand to one-hundred thousand for which said third specified frequency is equal to the difference between said certain second specified frequency and a frequency of 142040000.000 Hz.

7. The frequency synthesizer defined in claim 6, wherein said certain second specified frequency is 14205751.68 Hz, whereby said third specified frequency is 5751.68 Hz, and wherein said certain integer value of said preselected integer associated with said first pulse snatcher of said ordinal series is 28409.

8. The frequency synthesizer defined in claim 1, wherein said digital frequency translator further includes programmed means for adjusting the value of at least one of said preselected integers associated with said ordinal series of pulse snatchers and said additional frequency divider.

* * * * *

UNITED STATES PATENT AND TRADEMARK OFFICE
CERTIFICATE OF CORRECTION

PATENT NO. : 4,303,893

DATED : Dec. 1, 1981

INVENTOR(S) : Edwin A. Goldberg

It is certified that error appears in the above-identified patent and that said Letters Patent is hereby corrected as shown below:

Column 1, line 4, insert the following paragraph:
"The Government has rights in this invention pursuant to Contract No. N-00014-75-C-1148 awarded by the Department of the Navy."

Column 3, line 47, "siganl" should be ---signal---;

Column 6, line 26, "dividier" should be ---divider---;

Column 6, line 46, "preselcted" should ---preselected---;

Column 6, line 63, "snathcers" should be ---snatchers---;

Column 7, line 37, "frequeny" should be ---frequency---;

Column 8, line 29, "frquency" should be ---frequency---.

Signed and Sealed this

Twenty-second Day of June 1982

[SEAL]

Attest:

Attesting Officer

GERALD J. MOSSINGHOFF

Commissioner of Patents and Trademarks